United States Patent

Park et al.

[11] Patent Number: 5,882,835
[45] Date of Patent: Mar. 16, 1999

[54] POSITIVE PHOTORESIST RESIN AND CHEMICAL AMPLIFIED POSITIVE PHOTORESIST COMPOSITION CONTAINING THE SAME

[75] Inventors: Joo-Hyeon Park; Seong-Ju Kim; Ki-Dae Kim; Sun-Yi Park, all of Taejeon, Rep. of Korea

[73] Assignee: Korea Kumho Petrochemical Co., Ltd., Seoul, Rep. of Korea

[21] Appl. No.: 932,415

[22] Filed: Sep. 17, 1997

[30] Foreign Application Priority Data

Sep. 21, 1996 [KR] Rep. of Korea ................. 1996 41435

[51] Int. Cl.$^6$ ............. G03F 7/004; C08F 16/02; C08F 16/12
[52] U.S. Cl. ............. 430/170; 430/270.1; 430/905; 522/31; 522/57; 522/59; 525/328.8; 525/333.3; 525/284; 526/313
[58] Field of Search ............. 430/270.1, 905, 430/170; 526/313; 525/328.8, 333.3, 284; 522/31, 57, 59

[56] References Cited

U.S. PATENT DOCUMENTS

| | | | |
|---|---|---|---|
| 5,185,407 | 2/1993 | Wong | 523/313 |
| 5,324,804 | 6/1994 | Steinmann | 526/313 |
| 5,403,695 | 4/1995 | Hayase et al. | 430/270.1 |
| 5,679,496 | 10/1997 | Ohsawa et al. | 430/270.1 |
| 5,759,750 | 6/1998 | Binder et al. | 430/270.1 |

*Primary Examiner*—John S. Chu
*Attorney, Agent, or Firm*—Harrison & Egbert

[57] ABSTRACT

A chemical amplified positive photoresist composition including a resin having the repeating unit of Formula I and a photoacid generator. The resin ranges, in polystyrene-reduced molecular weight, from about 2,000 to 1,000,000. In Formula I, k and l each represent a mole ratio satisfying the condition of k+l=1. $R_1$ is a hydrogen atom or a methyl group. $R_2$ and $R_3$ are independently either a hydrogen atom, a halogen atom, an alkyl group or an alkoxy group. $R_4$ is an acetate group, a t-butoxycarbonyl group, a benzyl group, a trialkylsilyl group or an alkyl group. The photoacid generator which generates an acid by radiation.

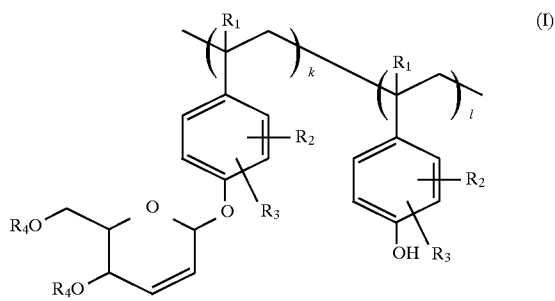

4 Claims, No Drawings

POSITIVE PHOTORESIST RESIN AND CHEMICAL AMPLIFIED POSITIVE PHOTORESIST COMPOSITION CONTAINING THE SAME

BACKGROUND OF THE INVENTION

1. Field of the invention

The present invention relates to a positive photoresist resin useful for semiconductor devices and to a chemical amplified positive photoresist composition comprising the same.

2. Description of the Prior Art

It is known that positive photoresist compositions consist, in general, of two or three components. The two-component system photoresist composition comprises a polymeric resin which can be chemically changed by the reaction with acid and a compound which can generate acids when being exposed to light (hereinafter referred to as "photoacid generator") while the three-component system comprises a resin which can be dissolved in aqueous alkali solutions (hereinafter referred to as "alkali soluble resin"), a dissolution inhibitor and a photoacid generator.

As for the resin of the two-component system photoresist composition, it is selected from phenolic resins containing a poly(4-t-butoxycarbonyloxystyrene) chain protected by t-butoxycarbonyl groups and acrylic resins containing a poly(t-butylmethacrylate) protected by t-butyl groups. The phenolic resins require a strong acid to remove the protecting group from themselves. Thus, unless a baking process is executed immediately after an exposing process, a base present in the air causes neutralization in the exposed region, resulting in development into a T-type pattern. Meanwhile, the t-butyl group-protected acrylic resins are superior in adhesiveness but poor in etch resistance.

As an alternate for the photoresist resin was developed poly(t-butyl-4-vinylbenzoate). A significant disadvantage of this resin is that the resonance between the phenyl ring and the carbonyl group allows the resin to show a large absorption peak at around 248 nm, which belongs to a light source useful for microlithography. In order to overcome the disadvantage, study has recently been focused on copolymeric resins. For example, copolymers of para-hydroxystyrene and para-t-butoxycarboxystyrene, copolymers of para-hydroxystyrene and para-tetrahydropyranyloxystyrene, and copolymers of para-hydroxystyrene and t-butylacrylate are found to be reduced in absorption at around 248 nm. However, the photoresist compositions resulting from these resins still show a problem in that desired patterns cannot be obtained if the compositions are subjected to a baking process with the lapse of time after exposure to light.

SUMMARY OF THE INVENTION

The intensive and thorough research repeated by the present inventors aiming to develop a photoresist resin which is readily de-protected by weak acids resulted in finding that an acetal protecting group can be removed by weak acids and can be grafted to phenol resins by reaction with vinyl ether derivatives. Many experiments showed that, even when strong acid is converted into weak acid by ammonia in the air, chemical amplified positive photoresist compositions comprising such protected phenol resins can easily remove the protecting group from themselves, affording excellent images without T-type pattern.

Therefore, it is an object of the present invention to provide a photoresist resin showing such superior pattern preservativity and resolution that allows it to be suitable for the formation of fine pattern in a semiconductor device.

It is another object of the present invention to provide a chemical amplified photoresist composition comprising the resin.

In accordance with an aspect of the present invention, there is provided a resin ranging, in polystyrene-reduced molecular weight, from about 2,000 to 1,000,000, represented by the following formula I:

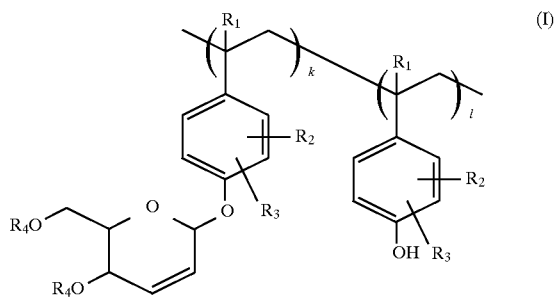

wherein k and l each represent a mole ratio, satisfying the condition of k+l=1; $R_1$ is a hydrogen atom or a methyl group; $R_2$ and $R_3$ are independently a hydrogen atom, a halogen atom, an alkyl group or an alkoxy group; $R_4$ is an acetate group, a t-butoxycarbonyl group, a benzyl group, trialkylsilyl group or an alkyl group.

In accordance with another aspect of the present invention, there is provided a chemical amplified positive photoresist composition comprising the resin.

DETAILED DESCRIPTION OF THE INVENTION

The present invention is provided by a resin for preparing the photoresist composition in which the repeating unit is represented by Formula I and a positive photoresist composition comprising said resin and a photoacid generator. More particularly, the photoresist composition is related to the positive photoresist composition useful for ultrafine processing by using radiation such as KrF excimer raser (248.4 nm of wavelength) being i-line or ultraviolet having wavelength of less than 300 nm.

The resins having the repeating unit of the general formula I can be easily prepared from alkali soluble phenolic resins and vinylether derivatives in the presence of acid catalyst, as shown in the following chemical formula II:

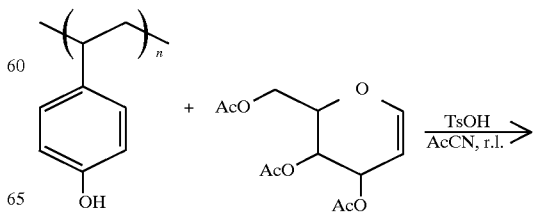

-continued

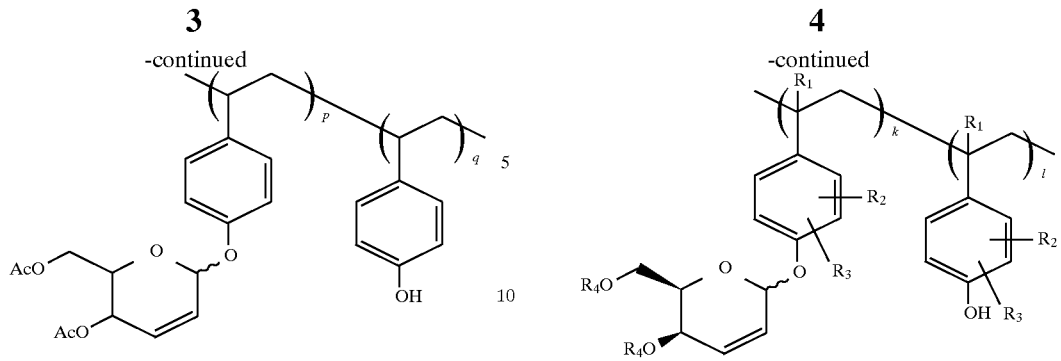

wherein n=p+q, Ts stands for a toluene sufonyl group, and Ac stands for an acetyl group.

Examples of the alkali soluble phenolic resins include polyhydroxystyrene, polyhydroxymethylstyrene, novolak resins, copolymers of hydroxystyrene and other monomers, copolymers of hydroxymethylstyrene and other monomers, etc. As for the vinylether derivatives, they include triacetylglucal, tribenzylglucal, tri-t-butoxycarbonylglucal, tri(trimethylsilyl)glucal, etc.

Useful examples of the acidic catalyst include toluene sulfonic acid, methane sulfonic acid, hydrochloric acid, sulfuric acid, nitric acid, trifluoracetic acid, trifluormethane sulfonic acid, and oxalic acid.

The reaction is carried out in a solvent containing no hydroxy group, such as acetonitrile, dichloromethane, chloroform, tetrahydrofuran, ether, dimethylformamide or dimethylsulfoxide.

The reaction is carried out at a temperature ranging from −20° to 80° C. and preferably around 20° C.

The molecular weight of the resin produced through reaction can be controlled by the molecular weight of the alkali soluble phenolic resin added and by the amount of the vinylether derivative substituted to the alkali soluble phenolic resin. As for substitution degree, it can be modulated by reaction time. In the present invention, the resin having the repeating unit of Formula I has a polystyrene-reduced average molecular weight of 2,000–1,000,000 and more preferably 3,000–40,000.

The repeating unit of Formula I can be in either of the two optical isomers, as shown in the following formula III:

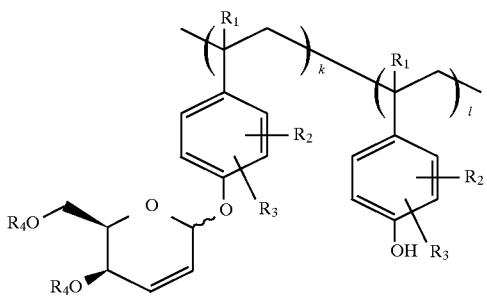

wherein k, l, $R_1$, $R_2$, $R_3$ and $R_4$ each are as defined above. Both of the isomer forms, as well as their racemates, are involved in the present invention.

As mentioned above, the chemical amplified positive photoresist composition of the present invention comprises a resin having the repeating unit of Formula I and a photoacid generator. In the present invention may be used at least one resin represented by Formula I or mixture with other alkali soluble resin(s).

As for the photoacid generator, it is selected from onium salts including iodonium salts, sulfonium salts, phosphonium salts, diazonium salts and pyridium salts. Over the salts, triphenylsulfonium triflate, triphenylsulfonium hexafluoroantimonate, diphenyliodonium triflate, and diphenyliodonium methylbenzenesulfonate are preferred. The photoacid generator also can be selected from halogen compounds including 1,1-bis(4-chlorophenyl)-2,2,2-trichloroethane, phenyl-bis(trichloromethyl)-s-triazine, and naphthyl-bis(trichloromethyl)-s-triazine. Further, diazoketone compounds, such as 1,3-diketo-2-diazo compounds, diazobenzoquinone compounds and diazonaphthoquinone compounds, sulfone compounds, sulfonic acid compounds, and nitrobenzyl compounds can be used as the photoacid generator. Of these photoacid generators, onium compounds and diazoketone compounds are specially preferable. Based on 100 weight parts of the total solid content of the composition, the photoacid generator is used at an amount of 0.1–30 weight parts and preferably 0.3–10 weight parts. The photoacid generators exemplified may be used alone or in combination with two or more species.

In the present invention, the acid produced from the photoacid generator upon radiation firstly breaks the acetal bonds of the resin having the repeating unit of Formula I, to convert the alkali insoluble resin into alkali soluble one, while producing polyvinyl phenol. The remaining parts from which polyvinylphenol is divided are decomposed depending on the functional groups to produce polyhydroxy compounds which subsequently are dissolved in alkali developing solution. As such, the resist materials in which the radiated region is dissolved in alkali developing solutions to be removed, is called positive photoresist.

In the photoresist composition of the present invention, if necessary, may be used additives, including surfactant, azo compounds, halation inhibitor, adhesive aid, preservative, anti-foaming agent, etc. Examples of surfactant include polyoxylaurylether, polyoxyethylenestearylether, polyoxyethyleneoleylether, polyoxyethyleneoctylphenolether, polyoxyethylenonylphenolether, and polyethyleneglycoldilaurate. It is preferably used at an amount of 2 weight parts or less based on 100 weight parts of the total solid content of the photoresist composition.

To obtain a uniform and smooth coating film, a solvent for the photoresist composition should have appropriate volatility and viscosity. The solvents showing such physical properties include ethyleneglycol monomethylether, ethyleneglycol monoethylether, ethyleneglycol monopropylether, ethyleneglycol monobutylether, diethyleneglycol dimethylether, diethyleneglycol diethylether, diethyleneglycol dipropylether, diethyleneglycol dibutylether, methylcellosolveacetate, ethylcellosolveacetate, propyleneglycol monomethylether acetate, propyleneglycol monoethyletheracetate, propyleneglycol monopropyletheracetate, methylethylketone, cyclohexanone, methyl 2-hydroxypropionate, ethyl 2-hydroxypropionate, 2-heptanone, N-methylpyrrolidone, N,N-dimethylformamide, N,N-dimethylacetamide, ethylpyruvate, n-amylacetate, ethyl lactate, and gamma-butyrolactone and, if necessary, may be used alone or in combination. As for the amount of solvent, it is dependent on the physical properties, that is, volatility and viscosity and may be controlled in such a way that the composition be uniformly coated on a wafer.

In the present invention, if necessary, a compound may be used which is decomposed by an acid and promotes the dissolution of the composition in a developing solution. As said compound, aromatic polyhydroxy compounds protected by t-butoxycarboxy group may be mentioned. They may be used alone or in combination and are added to the composition at an amount of 5–80 weight parts, and preferably 10–50 weight parts per 100 weight parts of the total solid content of the composition and preferably 10–50 weight parts.

The photoresist composition in accordance with the present invention is prepared in solution phase. The photoresist coating film is formed by appling the composition on a wafer and drying it. Spin coating, flow coating or roll coating may be mentioned as a coating method of the photoresist solution.

For the formation of fine pattern, the resist film coated by this method should be partly exposed to radiation. At this time, the radiation may be used without any specific restriction, but, for example, i-line (a uv light), excimer laser (a deep uv light), synchtron (an X-ray), and an electron beam (a charged particle ray) may be used depending on the photoacid generator. After being radiated, the film, if necessary, may be subjected to thermal treatment in order to increase sensitivity.

A developing solution useful for the radiated film is selected from aqueous solutions containing sodium hydroxide, potassium hydroxide, sodium carbonate, sodium silicate, sodium methasilicate, ammonia, ethyl amine, n-propylamine, triethylamine, tetramethylammonium hydroxide or tetraethylammonium hydroxide, and preferably tetramethylammonium hydroxide. If necessary, surfactants and/or aqueous alcohols may be used as additives.

A better understanding of the present invention may be obtained in light of following examples which are set forth to illustrate, but are not to be construed to limit, the present invention.

SYNTHESIS EXAMPLE I 15 g of polyvinylphenol (polystyrene-reduced molecular weight 9,300) and 51 g of triacetylglucal were dissolved in 100 ml of acetonitrile in a 300 ml flask. After dissolving polyvinylphenol, 0.48 g of toluenesulfonic acid monohydrate was added and reacted for 30 min at room temperature. After the completion of the reaction, the reactants were slowly poured in a flask containing 500 ml of distilled water, to produce precipitates which were, then, filtered and dried in vacuo. The resulting filtrate was dissolved in 100 ml of ethylacetate. This solution was slowly poured in a flask containing 700 ml of toluene, to produce precipitates. Subsequently, the precipitates were filtered and dried in vacuo, to obtain 22 g of Resin A (polystyrene-reduced molecular weight 16,200).

SYNTHESIS EXAMPLE II

A similar procedure to that of Synthesis Example I was carried out except that the reaction time was extended to 60 min instead of 30 min. 27 g of Resin B (polystyrene-reduced molecular weight 19,600) was obtained.

SYNTHESIS EXAMPLE III.

The procedure of Synthesis Example I was repeated using polyvinylphenol (polystyrene-reduced molecular weight 4,700) instead of polyvinylphenol(polystryrene-reduced molecular weight 9,300). 24 g of Resin C (polystyrene-reduced molecular weight 8,600) was obtained.

SYNTHESIS EXAMPLE IV

The procedure of Synthesis Example I was repeated using polyvinylphenol (polystyrene-reduced molecular weight 1,800) instead of polyvinylphenol(polystyrene-reduced molecular weight 9,300) of Synthesis Example I. 20 g of Resin D (polystyrene-reduced molecular weight 3,400) was obtained.

SYNTHESIS EXAMPLE V

The procedure of Synthesis Example I was repeated using 71 g of tribenzylglucal instead of triacetylglucal used in Synthesis Example I. 53 g of Resin E (polystyrene-reduced molecular weight 25,000) was obtained.

EXAMPLE I 100 weight parts of Resin A of Synthesis Example I and 3 weight parts of triphenylsulfonium triflate were dissolved in 288 weight parts of propyleneglycol monomethylether. The resulting solution was filtered through a teflon filter with a pore size of 0.1 $\mu$m, to give a photoresist solution. The obtained photoresist solution was applied on a silicon wafer washed in common method to be the coating thickness of 0.8 $\mu$m and then, was subjected to soft baking at 80° C. for 120 sec. The soft-baked coating film was exposed through a pattern chrome mask by a KrF excimer laser steper using 248 nm UV. After the exposure, the film was subjected to post-baking at 90° C. for 30 sec.

A developing process was carried out by immersing the wafer in a 2.38 wt % tetramethylammonium hydroxide solution in water, to form a positive pattern. It was found that the positive pattern had a good cross section 0.3 $\mu$m thick at an exposure energy of 30 mJ/cm$^2$ as observed with an electron microscope.

EXAMPLE II

The procedure of Example I was repeated using Resin B of Synthesis Example II instead of Resin A of Example I. It was found that the positive pattern had a good cross section 0.3 $\mu$m thick at an exposure energy of 35 mJ/cm$^2$.

EXAMPLE III

A similar procedure to that of Example I was carried out except that 100 weight parts of Resin C of Synthesis Example III and 2 weight parts of triphenylsulfonium triflate were used and the post-baking was performed at 90° C. for 20 sec. It was found that the positive pattern had a good cross section 0.25 μm thick at an exposure energy of 25 mJ/cm².

EXAMPLE IV

The procedure of Example III was repeated using Resin D of Synthesis Example IV instead of Resin C of Synthesis Example III. It was found that the positive pattern had a good cross section 0.3 μm thick at an exposure energy of 30 mJ/cm².

EXAMPLE V

The procedure of Example I was repeated using Resin E of Synthesis Example V instead of Resin A of Example I. It was found that the positive pattern had a good cross section 0.35 μm thick at an exposure energy of 30 mJ/cm².

EXAMPLE VI

A similar procedure to that of Example I was carried out except using 3.0 weight parts of triphenylsulfonium hexafluoroantimonate instead of triphenylsulfonium triflate. It was found that the positive pattern had a good cross section 0.35 μm thick at an exposure energy of 30 mJ/cm².

As apparent from the above examples, the positive photoresist resin of the present invention in which an acetal group is present as a protecting group which can be easily deprotected even by weak acid, has advantages over conventional ones, in that its preparation is relatively easy and the protecting group can be readily removed even when the post-baking is executed at low temperatures.

As described hereinbefore, the present invention is a chemical amplified positive photoresist composition comprising a resin having an acetal group as a protecting group, which is superior in adhesiveness and thermal stability as well as shows such a large difference of alkali solubility between exposed and un-exposed regions that any radiation including i-line (a uv light), excimer laser (a deep uv light), synchtron (an X-ray), and an electron beam (a charged particle ray) can be used for the photoresist. In addition, following the post-baking, even if the strong acid generated from the photoacid generator is converted into a weak acid by the ammonia in the air, the protecting group is readily removed by the weak acid so that the photoresist composition can afford excellent images without T-type pattern. Therefore, the positive photoresist composition of the present invention is suitable for the fabrication of semiconductor devices by virtue of its superior storage stability and resolution.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A resin comprising the following formula I:

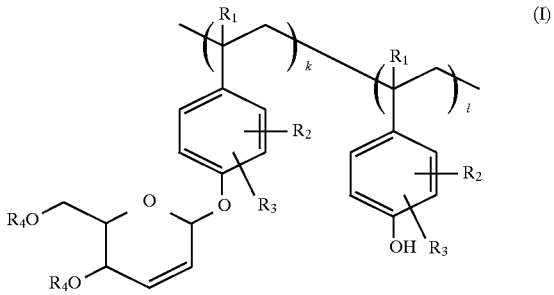

wherein k and l each represent a positive mole ratio satisfying the condition of k+l=1; $R_1$ is selected from the group consisting of a hydrogen atom and a methyl group; $R_2$ and $R_3$ are independently selected from the group consisting of a hydrogen atom, a halogen atom, an alkyl group and an alkoxy group; $R_4$ is selected from the group consisting of an acetate group, a t-butoxycarbonyl group, a benzyl group, a trialkylsilyl group and an alkyl group, said resin ranging from 2000 to 1,000,000 in polystyrene-reduced weight-average molecular weight.

2. A chemical amplified positive photoresist composition comprising a resin having the repeating unit of the following formula I:

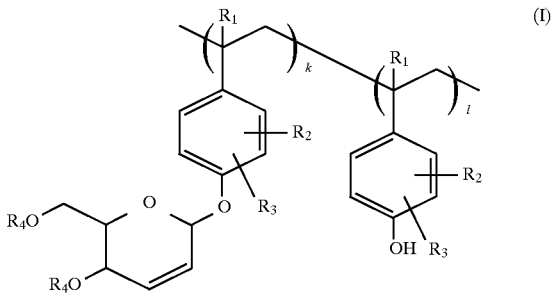

wherein k and l each represent a positive mole ratio satisfying the condition of k+l=1; $R_1$ is selected from the group consisting of a hydrogen atom and a methyl group; $R_2$ and $R_3$ are independently selected from the group consisting of a hydrogen atom, a halogen atom, an alkyl group and an alkoxy group; $R_4$ is selected from the group consisting of an acetate group, a t-butoxycarbonyl group, a benzyl group, a trialkylsilyl group and an alkyl group, and a photoacid generator which generates an acid by radiation.

3. A chemical amplified positive photoresist composition in accordance with claim 2, wherein said photoacid generator is selected from the group consisting of triphenylsulfonium triflate, diphenyl(4-t-butylphenyl)sulfonium triflate, diphenyl(4-methoxyphenyl)sulfonium triflate, triphenylsulfonium hexafluoroantimonate, diphenyliodonium triflate, diphenyliodonium methylbenzenesulfonate, 1,1-bis(4-chlorophenyl)-2,2,2-trichloroethane, phenyl-bis-(trichloromethyl)-s-triazine, naphthyl-bis(trichloromethyl)-s-triazine, bis(cyclohexylsulfonyl)diazomethane, and bis(2,4-dimethylphenylsulfonyl)diazomethane.

4. A chemical amplified positive photoresist composition in accordance with claim 2, wherein said photoacid generator is present in an amount of 0.1–30 weight parts based on 100 weight parts of said resin having the repeating unit of Formula I.

* * * * *